US008804295B2

(12) United States Patent
Lewis

(10) Patent No.: US 8,804,295 B2
(45) Date of Patent: Aug. 12, 2014

(54) CONFIGURABLE MULTI-GATE SWITCH CIRCUITRY

(75) Inventor: David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 356 days.

(21) Appl. No.: 12/579,792

(22) Filed: Oct. 15, 2009

(65) Prior Publication Data

US 2011/0089008 A1 Apr. 21, 2011

(51) Int. Cl.

| | |
|---|---|
| ***H01H 47/26*** | (2006.01) |
| ***H01H 50/12*** | (2006.01) |
| *H01H 57/00* | (2006.01) |
| *H01L 29/788* | (2006.01) |

(52) U.S. Cl.
USPC ............................ 361/211; 200/181; 257/316

(58) Field of Classification Search
USPC ............................ 361/211
See application file for complete search history.

(56) References Cited

U.S. PATENT DOCUMENTS

| | | | | |
|---|---|---|---|---|
| 5,359,571 | A * | 10/1994 | Yu | 365/185.13 |
| 5,638,946 | A | 6/1997 | Zavracky | |
| 6,153,839 | A | 11/2000 | Zavracky et al. | |
| 6,218,890 | B1 * | 4/2001 | Yamaguchi et al. | 327/427 |
| 6,323,834 | B1 | 11/2001 | Colgan et al. | |
| 6,324,748 | B1 | 12/2001 | Dhuler et al. | |
| 6,495,387 | B2 * | 12/2002 | French | 438/52 |
| 6,509,605 | B1 * | 1/2003 | Smith | 257/316 |
| 6,511,894 | B2 | 1/2003 | Song | |
| 6,556,042 | B1 * | 4/2003 | Kaviani | 326/39 |
| 6,618,034 | B1 * | 9/2003 | Sugahara et al. | 345/109 |
| 6,639,493 | B2 * | 10/2003 | Shen et al. | 335/78 |
| 6,731,492 | B2 | 5/2004 | Goodwin-Johansson | |
| 7,034,373 | B2 * | 4/2006 | Allison et al. | 257/415 |
| 7,349,236 | B2 * | 3/2008 | Lin et al. | 365/129 |
| 2008/0031452 | A1 | 2/2008 | Rowe | |

FOREIGN PATENT DOCUMENTS

| | | | |
|---|---|---|---|
| CN | 1346503 | A | 4/2002 |
| CN | 1755477 | | 4/2006 |
| JP | 2003516629 | | 5/2003 |
| WO | 0143153 | | 6/2001 |
| WO | 01043153 | | 6/2001 |
| WO | 2007130913 | | 11/2007 |
| WO | WO2008/031452 | * | 3/2008 |

OTHER PUBLICATIONS

Chen, "NEM Relays for FPGAs," Apr. 21, 2009.
Chen, "Design of Efficient FPGAs using NEM Relays," Jun. 4, 2009.

* cited by examiner

*Primary Examiner* — Jared Fureman
*Assistant Examiner* — Lucy Thomas
(74) *Attorney, Agent, or Firm* — Treyz Law Group; Jason Tsai

(57) ABSTRACT

Integrated circuits with configurable multi-gate switch circuitry are provided. The switch circuitry may include switch control circuitry and an array of multi-gate switches. Each multi-gate switch may have first and second terminals, first and second gates, and a metal bridge. The metal bridge is attached to the first terminal. The metal bridge may extend over the gates and may hover above the second terminal in the off state. The metal bridge may have a tip that bends down to physically contact the second terminal in the on state. Switch control circuitry may provide row and column control signals to load desired switch states into the switch array. The switch array may be partitioned into groups of switches that form multiplexers. The multiplexers may be used in programmable circuits such as programmable logic device circuits.

10 Claims, 11 Drawing Sheets

| | VOLT(V) |
|---|---|
| VPO | 2 |
| VPI | 11 |

FIG. 4

| VG1 | VOLT(V) |
|---|---|
| V1 | 0 |
| V2 | 5 |
| V3 | 10 |
| V4 | 3 |

FIG. 5

| VG2 | VOLT(V) |
|---|---|
| VA | 0 |
| VB | 5 |
| VC | 3 |

FIG. 6

| | VG1 | VG2 | VGS1+VGS2 | | MODE |
|---|---|---|---|---|---|
| | | | 2VS=0 | 2VS=2.0 | |
| A | 0 | 0 | 0 | -2 | ERASE |
| B | 0 | 5 | 5 | 3 | HOLD |
| C | 5 | 0 | 5 | 3 | HOLD |
| D | 5 | 5 | 10 | 8 | HOLD |
| E | 10 | 0 | 10 | 8 | HOLD |
| F | 10 | 5 | 15 | 13 | CLOSE |
| G | 3 | 3 | 6 | 4 | OPERATE |

FIG. 7

CONFIGURABLE MULTI-GATE SWITCH CIRCUITRY

BACKGROUND

This invention relates to multi-gate switches, and more particularly, to multi-gate electro-mechanical switches that can be configured to store desired switch states.

Integrated circuits often include switches. A switch may be turned on to form an electrical connection across the switch or may be turned off to break the electrical connection. Switches are typically formed from transistors such as metal-oxide-semiconductor (MOS) transistors. The use of electro-mechanical switches such as micro-electro-mechanical (MEM) switches has also been proposed. These switches, which are sometimes referred to as nano-electro-mechanical (NEM) switches, may be formed using microfabrication operations that leverage semiconductor processing techniques such as photolithographic patterning techniques.

A conventional electro-mechanical switch is formed on a substrate. The conventional electro-mechanical switch has a source terminal, a drain terminal, and a gate formed on the substrate. A cantilever beam is formed over the gate. The beam is attached to the source terminal. In its off state, the gate of the switch is driven to a low voltage. The beam has a tip that extends over the drain terminal. In the off state of the switch, the tip and the drain terminal are separated by air. No electrical connection is therefore formed between the source and drain terminals in the off state (e.g., the switch is open).

The gate of the conventional switch can be driven to a high voltage to place the switch in an on state. The source terminal is driven to a low voltage in the on state. In the on state, a gate-to-source voltage (e.g., the voltage difference between the gate and the source terminal) generates an electrostatic force that bends the beam so that the tip of the beam contacts the drain terminal. The beam serves as a conductive path for electrons, thereby forming an electrical connection between the source and drain terminals (e.g., the switch is closed).

Conventional electro-mechanical switches generally have a single gate. As a result, a dedicated controlling circuit (i.e., an address transistor) is required. The controlling circuit is connected to the gate of the switch. The controlling circuit determines whether the switch is turned on or off. For example, the controlling circuit can drive the gate to a high or low voltage to place the switch in an on or off state, respectively.

In a scenario in which more than one switch is used, each switch requires a corresponding controlling circuit to place the switch in its desired state. For example, a 64 by 128 array of switches would require 8192 (64 multiplied by 128) controlling circuits. Thus, in applications that use a large number of single-gate switches, a large number of controlling circuits would also be required to control each switch. The controlling circuits may consume an unacceptably large area on an integrated circuit.

It would therefore be desirable to be able to provide improved electro-mechanical switch circuitry.

SUMMARY

Integrated circuits may be provided with configurable multi-gate switch circuitry. The configurable multi-gate switch circuitry may include switch control circuitry and an array of multi-gate electro-mechanical switches. The switch control circuitry may provide row control signals and column control signals.

Each multi-gate switch in the array of multi-gate switches may include a first terminal, a second terminal, a first gate, and a second gate. A conductive flexible bridge structure (e.g., a cantilever beam or other flexible and therefore deflectable structure that is formed from a conductive material or that is coated with a conductive material) may be attached to the first terminal. The bridge structure may extend over the gates. The bridge may have a tip that hovers over the second terminal when the multi-gate switch is in an off state. The tip may be deformed by adjusting control signals on the first and second gates. For example, control signals may be placed on the first and second gates that cause the flexible bridge structure to deform by bending downwards to physically make contact with the second terminal when the multi-gate switch is in an on state.

The multi-gate switch may be configured (set to be open or closed) based on the voltage applied at the gates of the switch.

The column control signals may be provided to the first gates of the multi-gate switches. The row control signals may be provided to the second gates of the multi-gate switches. The column and row control signals may be adjusted so as to load desired switch states into the multi-gate switch array.

The switch array may be arranged into groups of switches. For example, groups of four switches may be formed. Each group of four switches may be used to implement a multiplexer. The multiplexers may be used in programmable circuits such as programmable logic device circuits.

Further features of the switch array circuitry, its nature and various advantages will be more apparent from the accompanying drawings and the following detailed description.

BRIEF DESCRIPTION OF THE DRAWINGS

FIGS. 4, 5, and 6 are tables showing illustrative voltage values that may be applied to the gates of a multi-gate switch in accordance with an embodiment of the present invention.

FIG. 7 is a table showing illustrative operating modes of a multi-gate electro-mechanical switch as a function of various combinations of applied gate voltages in accordance with an embodiment of the present invention.

DETAILED DESCRIPTION

Figure 1A:
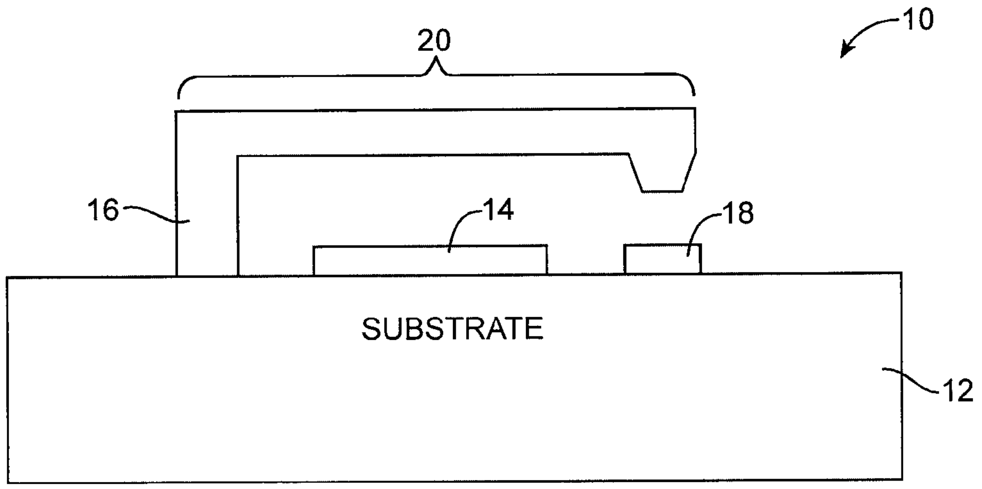
(PRIOR ART) FIG. 1A
FIG. 1A is a schematic cross-sectional side view of a conventional electro-mechanical switch.

Integrated circuits often require the use of switches. A switch may operate in an off state (i.e., the switch may be open) or may operate in an on state (i.e., the switch may be closed). The switch may be connected to two separate terminals in an electrical circuit. In the off state, the two terminals are electrically disconnected so that no current flows between the two terminals through the switch. In the on state, the two terminals are electrically connected so that current can flow between the two terminals. Integrated circuits that include arrays of switches may include cross-bar switch circuits, programmable integrated circuits such as programmable logic device integrated circuits, application-specific integrated circuits with configurable blocks of circuitry, etc.

Integrated circuits may have various types of switches. Integrated circuits may include metal-oxide-semiconductor (MOS) transistors. An MOS transistor includes a source terminal, a drain terminal, and a gate. The source-drain terminals are typically highly doped regions formed directly on a silicon substrate. The gate (e.g., polysilicon gate) is formed over a lightly doped region in the substrate that separates the source and drain terminals. A thin layer of gate oxide is formed between the polysilicon gate and the lightly doped region.

A channel is formed at the surface of the substrate (e.g., the lightly doped region) directly beneath the gate oxide. The source-drain terminals and the gate can be driven to a first set of voltages that turns on the MOS transistor. In the on state, current flows between the source and drain terminals through the channel. The source-drain terminals and the gate can be driven to a second set of voltages that turns off the MOS transistor. In the off state, current stops flowing between the source and drain terminals.

The control of electric field (e.g., electric field arising from the voltage difference between the gate and the source terminal) in the channel determines whether or not current flows through the MOS transistor. When a MOS transistor switches (e.g., from the off state to the on state or vice versa), the gate of the MOS transistor never physically moves.

In addition to MOS transistors, integrated circuits may include electro-mechanical switches such as micro-electro-mechanical systems (MEMS) switches. Small versions of these switches are sometimes referred to as nano-electro-mechanical (NEM) switches. For use on integrated circuits, MEMS switches may be fabricated with dimensions that are roughly comparable to those of modern transistor circuits (e.g., less than 10 square microns, less than 1 square micron, less than 0.1 square microns, etc.). In a typical fabrication scheme, a silicon substrate may be etched and patterned using semiconductor fabrication techniques (e.g., lithography, wet and/or dry etching, vapor deposition, oxidation, etc.). The use of semiconductor fabrication techniques to form MEMS switches allows the switches to be fabricated with compact dimensions.

In contrast to MOS transistors, electro-mechanical switches have parts that physically move during switching. Although some types of electro-mechanical switches may consume somewhat more area than certain MOS transistor switches, electro-mechanical switches may exhibit enhanced performance. For example, electro-mechanical switches may exhibit zero leakage current and improved radiation tolerance relative to MOS transistor switches. If desired, MOS transistors and electro-mechanical switches may be fabricated on the same piece of silicon using semiconductor fabrication techniques that are compatible with both types of technology.

Figure 1B:
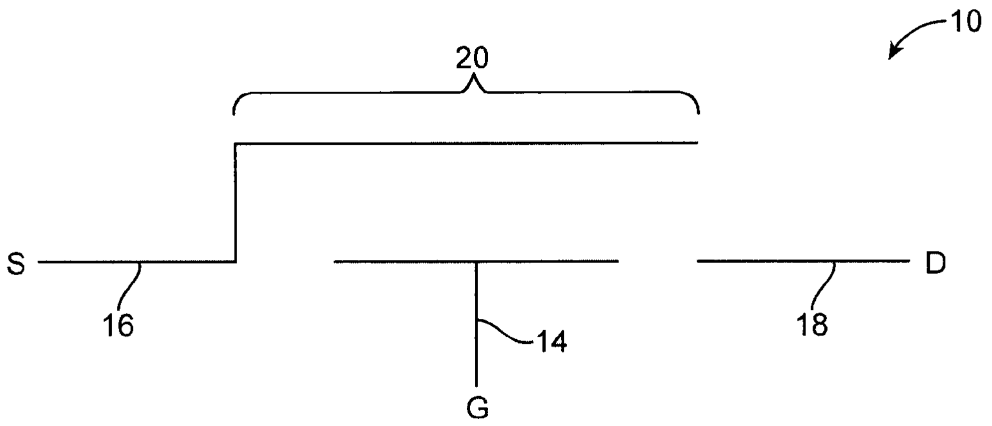
(PRIOR ART) FIG. 1B
FIG. 1B is a schematic diagram of a conventional electro-mechanical switch.

A cross-sectional view of conventional electro-mechanical switch 10 is shown in FIG. 1A (FIG. 1B shows the corresponding schematic symbol). Conventional switch 10 is formed on a substrate 12. Switch 10 has source terminal 16, drain terminal 18, and gate 14 formed on substrate 12. Switch 10 includes cantilever beam 20 attached to source terminal 16. Beam 20 extends over gate 14 and has a tip that hovers above drain terminal 18.

In the off state of the switch, the tip of beam 20 is separated from drain terminal 18 by air. In the on state of the switch, beam 20 is physically bent downwards so that the tip directly contacts drain terminal 18. The motion of beam 20 physically bending downwards introduces substantial mechanical delay. As a result, the switching time of electro-mechanical switches is typically slower than the switching time of MOS transistors.

Figure 2:
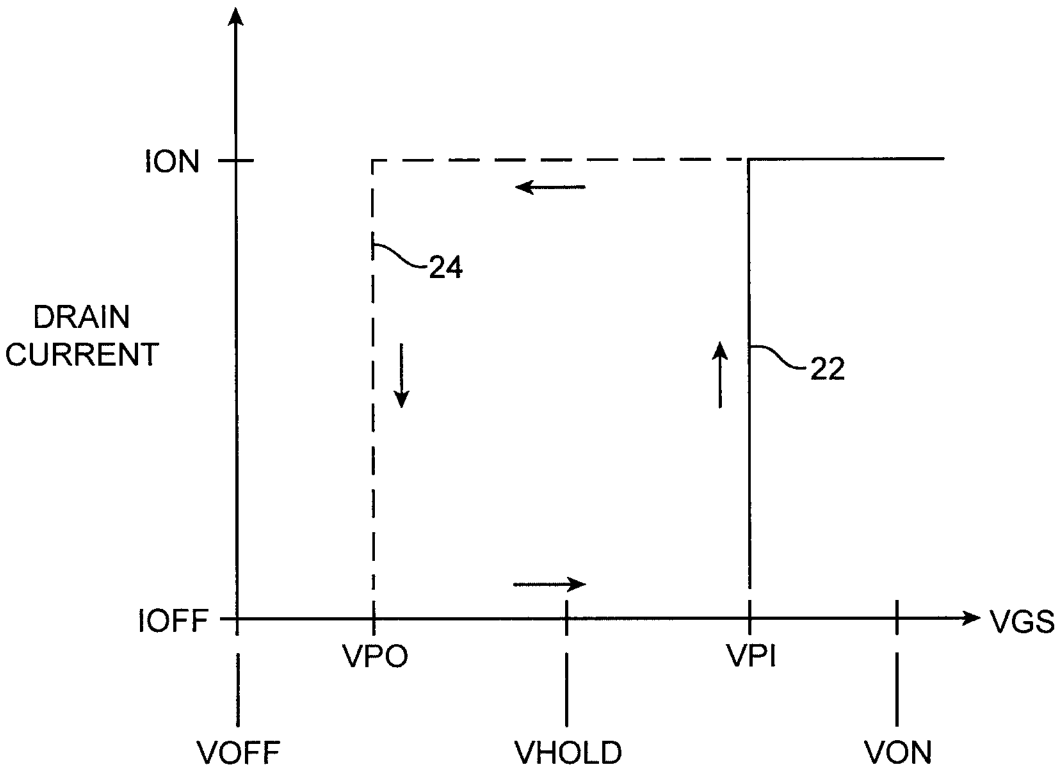
(PRIOR ART) FIG. 2
FIG. 2 is a graph showing the switching behavior of a conventional electro-mechanical switch.

The state of conventional switch 10 depends on the gate-to-source voltage (VGS). The gate-to-source voltage is the voltage difference between gate 14 and source terminal 16. FIG. 2 plots drain current versus VGS (e.g., illustrating the switching behavior of conventional switch 10). FIG. 2 assumes that source terminal 16 and drain terminal 18 are held at ground and supply voltages respectively.

Conventional switch 10 is open when gate 14 is driven to ground voltage VOFF (see, e.g., FIG. 2). No current flows through switch 10 in the off state, as indicated by zero current IOFF. If switch 10 is currently open, switch 10 will remain open even if gate 14 is raised to intermediate voltage VHOLD. This is because voltage VHOLD is insufficient to bend the beam of the switch enough to close the switch.

If conventional switch 10 is currently open, switch 10 will be switched on (e.g., closed) if gate 14 is raised to supply voltage VON. Supply voltage VON is greater than pull-in voltage VPI. Pull-in voltage VPI is the minimum threshold voltage that the gate voltage needs to overcome to close an open switch. Path 22 illustrates the behavior of switch 10 transitioning from the off state to the on state. Current flows through switch 10 in the on state, as indicated by current ION.

If conventional switch 10 is currently closed, switch 10 will remain closed even if gate 14 is lowered to intermediate voltage VHOLD. Intermediate voltage VHOLD is less than VPI but is greater than pull-out voltage VPO. The gate voltage must be driven to a voltage lower than pull-out voltage VPO to open a closed switch (i.e., to pull cantilever beam 29 out of physical contact with drain 18). Path 24 illustrates the behavior of switch 10 transitioning from the on state to the off state. The hysteresis that is exhibited by the curve of FIG. 2 results from the interplay between the mechanical structures of the MEMS switch.

Conventional switch 10 requires a dedicated controlling circuit (e.g., an address transistor) to control the voltage on gate 14 (e.g., in order to turn the switch on or off). Applications that use a large number of switches 10 would therefore require a large number of corresponding controlling circuits. For example, an array of 128 by 256 switches would require 32,768 (128 multiplied by 256) controlling circuits. The controlling circuits for conventional switches may therefore take up more area than desirable on an integrated circuit chip.

Figure 3A:
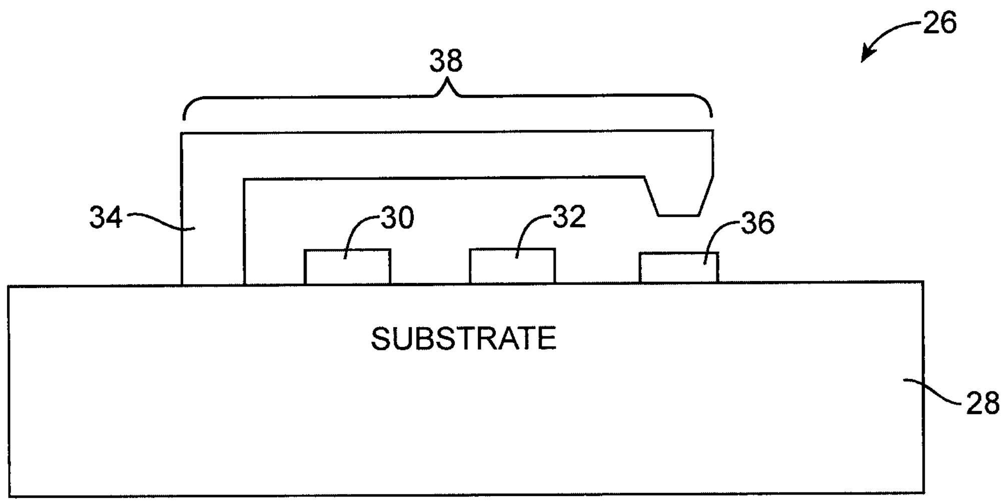
FIG. 3A is a schematic cross-sectional side view of an illustrative multi-gate electro-mechanical switch in accordance with an embodiment of the present invention.
Figure 3B:
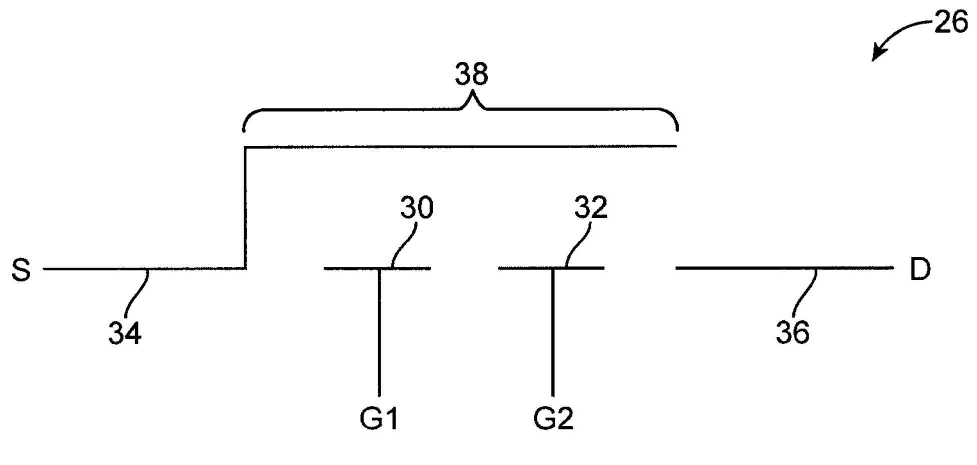
FIG. 3B is a schematic diagram of an illustrative multi-gate electro-mechanical switch in accordance with an embodiment of the present invention.

By using configurable multi-gate electro-mechanical switches, integrated circuits may be provided that may reduce the number of controlling circuits required to configure a switch. A cross-sectional view of configurable multi-gate electro-mechanical switch 26 of the type that may be used in an array of switches on an integrated circuit is shown in FIG. 3A. FIG. 3B shows the schematic symbol of multi-gate switch 26.

As shown in FIG. 3A, multi-gate switch 26 is formed on substrate 28. Substrate 28 may be silicon, germanium, silicon-on-insulator, glass and other insulating materials, etc. Multi-gate switch 26 may have first terminal 34, second terminal 36, first gate 30 (G1), and second gate 32 (G2) formed on substrate 28. In a typical arrangement, some or all of the structures of switch 26 may be formed using MEMS technology (e.g., using semiconductor fabrication techniques such as wet and/or dry etching, photolithographic patterning, vapor deposition, etc. to form miniature device structures). Terminals 34 and 36 form the main switch terminals for switch 26. When switch 26 is closed, current flows freely between terminals 34 and 36. Gate terminals 30 and 32 serve as control terminals. The state of switch 26 can be controlled by controlling the voltages applied to gate terminals 30 and 32.

The voltage on terminals 30 and 32 may be referred to as gate voltages VG1 and VG2 respectively. The voltage of terminal 34 may be referred to as source voltage VS. The voltage difference between G1 and second terminal 36 (e.g., VG1 minus VS) may be referred to as VGS1. The voltage difference between G2 and second terminal 36 (e.g., VG2 minus VS) may be referred to as VGS2. Multi-gate switch 26 may include a conductive bridge structure such as bridge 38 that is attached to first terminal 34. Bridge 38 may be implemented using a cantilever beam structure (as an example). As shown in the diagram of FIG. 3A, bridge 38 may extend over first gate 30 and second gate 32 and may have a tip that hovers above second terminal 36. First and second terminals 34 and 36 may sometimes be referred to as source-drain terminals.

Multi-gate switch 26 may have two critical threshold voltages such as pull-out voltage VPO and pull-in voltage VPI. In order to turn switch 26 from the off state to the on state, the overall gate-to-source voltage VGS12 (e.g., the sum of VGS1 and VGS2) must be increased to be greater than VPI. In order to turn switch 26 from the on state to the off state, overall VGS12 must be lowered until it is less than VPO. For example, pull-out voltage VPO and pull-in voltage VPI may be equal to 2 volts (V) and 11 V respectively (as shown in FIG. 4). In practice, the values of VGS1 and VGS2 may not be combined in a perfectly linear, equally weighted manner to form overall gate voltage VGS12. The method described herein can be easily extended to such a case by using a weighted sum or some other function of VGS1 and VGS2.

In order to configure an array of switches 26, switch control circuitry may adjust the voltages of gates G1 and G2. This may be accomplished efficiently using row and column control signal lines.

First gate 30 (G1) may be driven to various voltage values during different phases of operation. As an example, G1 may, at a given time, be driven to one of four different voltage values V1, V2, V3, and V4. As shown in FIG. 5, voltage values V1, V2, V3, and V4 may be equal to 0 V, 5 V, 10 V, and 3 V respectively.

Likewise, second gate 32 (G2) may be driven to various voltage values. For example, G2 may be driven to any one of three different voltage values VA, VB, and VC. Voltage values VA, VB, and VC may be equal to 0 V, 5 V, and 3 V respectively (as shown in FIG. 6).

The voltage values shown in FIGS. 4-7 are merely illustrative. First gate 30 may be driven to more or less than 4 voltage values, if desired. First gate 30 may be driven to at least 2 voltages values (e.g., a low voltage value and an intermediate voltage value). A multi-gate switch configured using only 2 voltages on VG1 may have lower noise margin. Similarly, second gate 32 may be driven to more than 3 voltage values. Other suitable voltage values may be used to drive G1 and G2, if desired.

The table of FIG. 7 lists possible combinations of gate voltages that can be applied to multi-gate switch 26. Rows A and B correspond to a first scenario in which the voltage of G1 (VG1) is driven to V1 (e.g., 0 V). Rows C and D correspond to a second scenario in which VG1 is driven to V2 (e.g., 5 V). Rows E and F correspond to a third scenario in which VG1 is driven to V3 (e.g., 10 V). Row G corresponds to a fourth scenario in which VG1 is driven to V4 (e.g., 3 V).

First, assume that the voltage of first terminal ("source") 34 is at 0 V. In the first scenario, VG2 may be driven to VA or VB. If VG2 is driven to VA (e.g., 0 V), overall VGS12 will be equal to 0 V (as shown in row A, col. 4). This overall VGS will be less than VPO and VPI. This combination of VG1 at V1 and VG2 and VA will therefore always open switch 26. Row A corresponds to an erase mode (sometimes also referred to as a reset or clear mode). If VG2 is driven to VB (e.g., 5 V), overall VGS12 will be equal to 5 V (row B, col. 4).

In the second scenario, VG2 will also be driven to VA or VB. If VG2 is driven to VA, overall VGS12 will be equal to 5 V (row C, col. 4). If VG2 is driven to VB, overall VGS12 will be equal to 10 V (row D, col. 4).

In the third scenario, VG2 may likewise be driven to VA or VB. If VG2 is driven to VA, overall VGS12 will be equal to 10 V (row E, col. 4). If VG2 is driven to VB, overall VGS12 will be equal to 15 V (row F, col. 4).

Overall VGS12 of rows B-E will be less than VPI (e.g., 11 V). Rows B-E therefore correspond to a hold mode in which the multi-gate switch remains in its current state (e.g., in the off state if the switch is currently off or in the on state if the switch is currently on). Overall VGS12 of row F may be greater than VPI. Row F may therefore correspond to a close mode in which the multi-gate switch transitions from the off state to the on state.

In the fourth scenario, VG1 and VG2 may each be driven to 3 V. Overall VGS12 will therefore be equal to 6 V. Because VGS12 of 6 V lies between VPO and VPI, row G corresponds to an operate mode. In the operate mode, a switch that is previously open will stay open whereas a switch that is previously closed will remain closed regardless of the value of VS. Unlike the various hold modes of rows B-E, the voltage VSG12 of the operate mode may be selected to be equal to an optimum operating point (i.e., an operating voltage that is unlikely to be disturbed by control signal fluctuations and fluctuations in the voltages passing through source-drain terminals 34 and 36).

The behavior of the multi-gate switches shown in FIG. 7 makes it possible to program a pattern of desired switch states into an array of switches using row and column control signals. The actions taken to erase or program the switches in a particular column can be performed on that column of switches without disrupting the states previously loaded into other columns.

The voltage of first terminal 34 (e.g., source voltage VS) may not always be at 0 V, in particular during operation of the device. Overall VGS12 may therefore change depending on the value of VS. Because VGS12 is equal to the sum VGS1 (e.g., VG1 minus VS) and VGS2 (e.g., VG2 minus VS), a change in VS will appear twice in the overall sum. For example, VS may be equal to 1 V. As a result, overall VGS may be lowered by two times VS (e.g., 2 V in this example).

This change in overall VGS12 is reflected in the fifth column of FIG. 7. The new VGS12 of row A still remains less than VPO and VPI (e.g., erase mode). The new VGS of rows B-E is still greater than VPO and less than VPI (e.g., hold mode). The new VGS of row F is still greater than VPI (e.g., close mode or program mode). The new VGS of row G is still between VPO and VPI (e.g., operate mode). For the operate mode, the value of V3 may be chosen to maximize a voltage margin between the operating margin of VGS12 and VPO on the low end (e.g., when VGS12 is closer to VPO) and between the operating margin of VPI and VPI on the high end (e.g., when VGS12 is closer to VPI).

Figure 8:
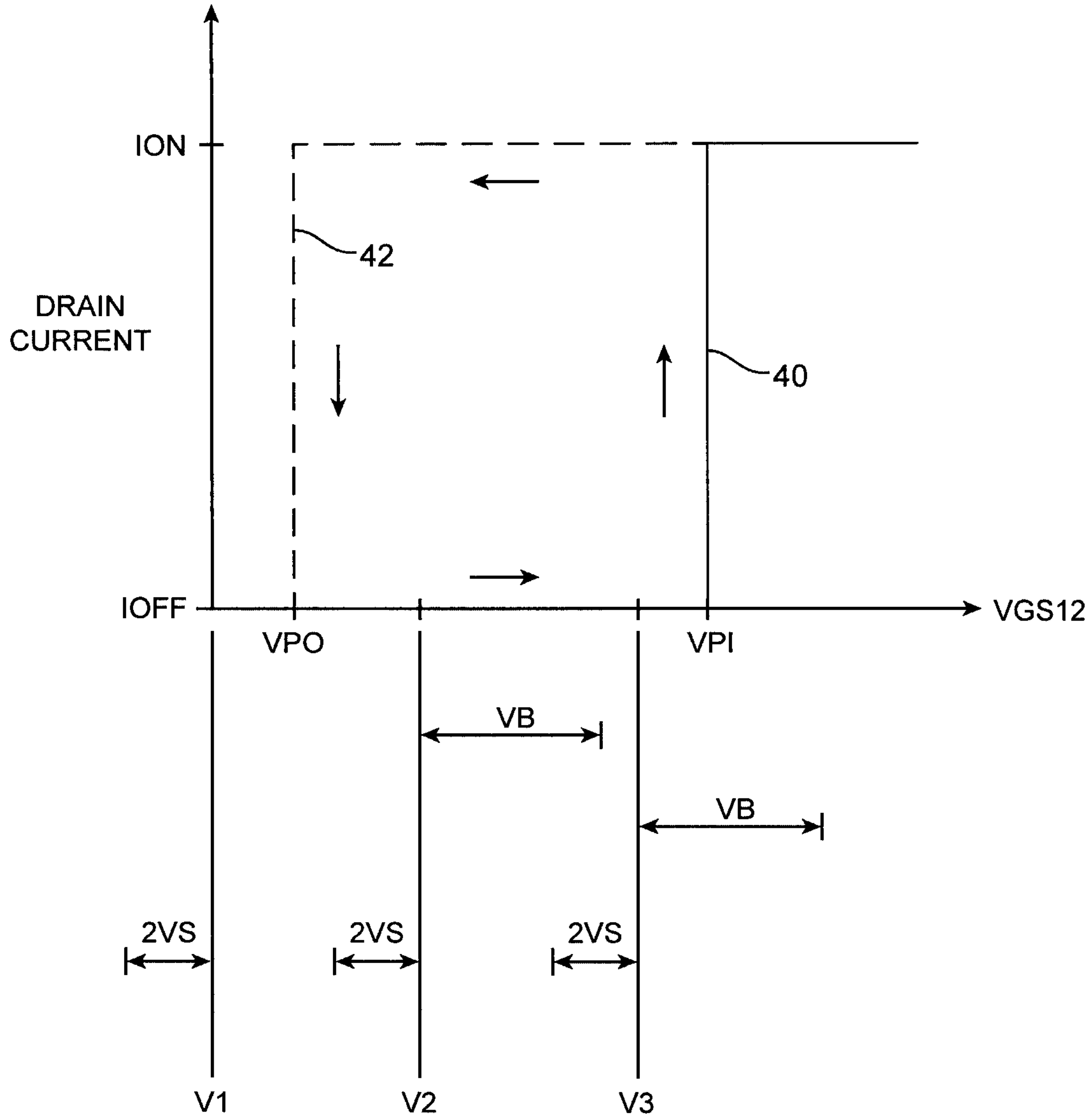
FIGS. 8 and 9 are plots showing the switching behavior of a multi-gate electro-mechanical switch in accordance with an embodiment of the present invention.

A graphical representation of the table in FIG. 7 is shown in FIG. 8. Switch 26 may traverse path 40 when transitioning from the off state to the on state and may traverse path 42 when transitioning from the on state to the off state. Pull-in voltage VPI may represent a threshold voltage at which a sufficiently large electrostatic potential is formed between the gates (e.g., G1 and G2) and first terminal 34 to close the switch. The sufficiently large electrostatic force may cause bridge 38 to bend downwards and contact second terminal 36. Atomic forces may cause bridge 38 to stay attached (e.g., "stick") to terminal 36 until VGS12 is dropped to a lower voltage that is less than VPI. The lower voltage may be pull-out voltage VPO.

A hysteresis loop may exist in the region between threshold voltages VPI and VPO (e.g., the transitions of paths 40 and 42). The hysteresis loop provides a memory effect in multi-gate switch 26. In other words, once the switch is loaded to a desired state (e.g., an on or off state), the switch may retain the desired state until enough stress is applied to the switch to make it exit the hysteresis loop (e.g., by driving overall VGS12 above VPI or below VPO).

Figure 9:
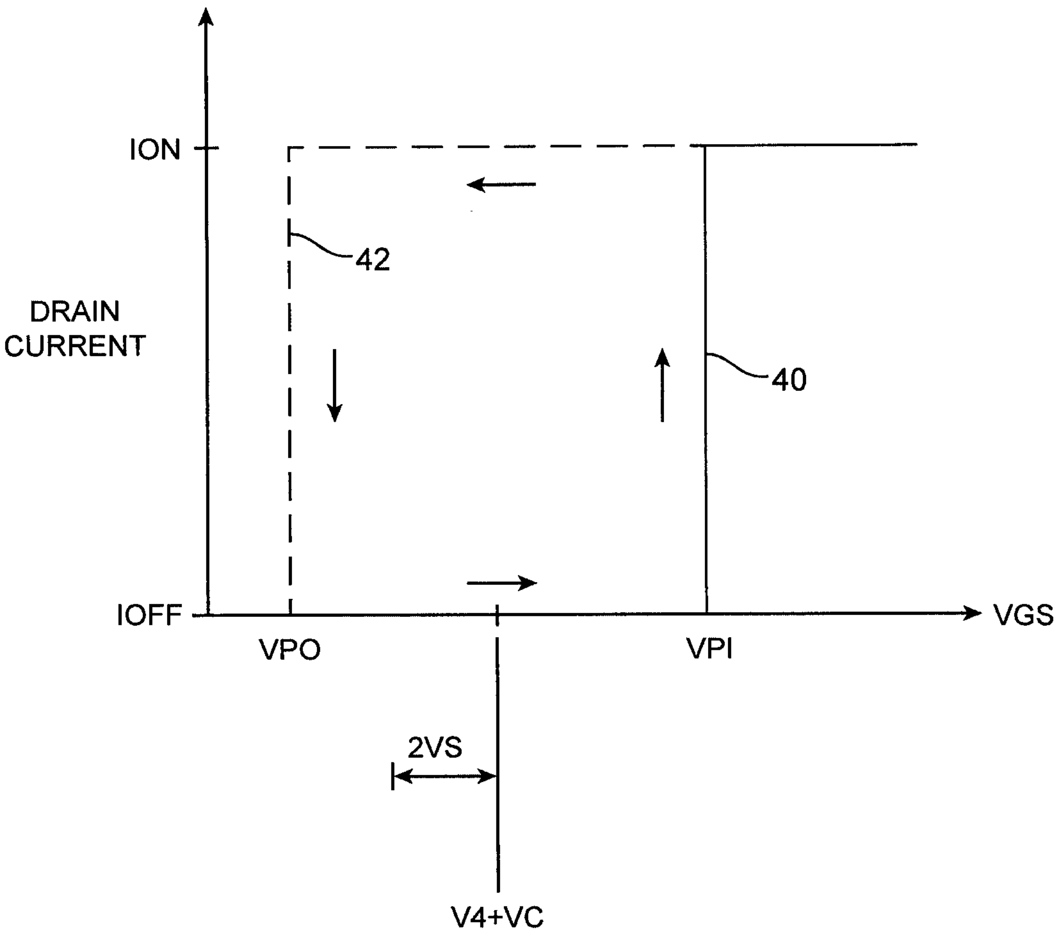

Multi-gate switch 26 may be placed in an operate mode once the desired switch state has been loaded. In the operate mode, overall VGS12 may be driven to an operate voltage (e.g., the sum of V4 and VC). As shown in FIG. 9, a positive change in VS may cause overall VGS12 to decrease by two times VS. Due to the signals transmitted on the source during operation, change in VS is also possible (e.g., from 0 V to −1 V). This negative change in VS may increase the overall VGS12 by two 2 V, for example. It may therefore be desirable to set the operate voltage at the midpoint of the hysteresis loop (e.g., at an optimum voltage value that is equal to the average of VPO and VPI). Operated in this way, switch 26 may have maximum toleration to VS variation.

Figure 10:
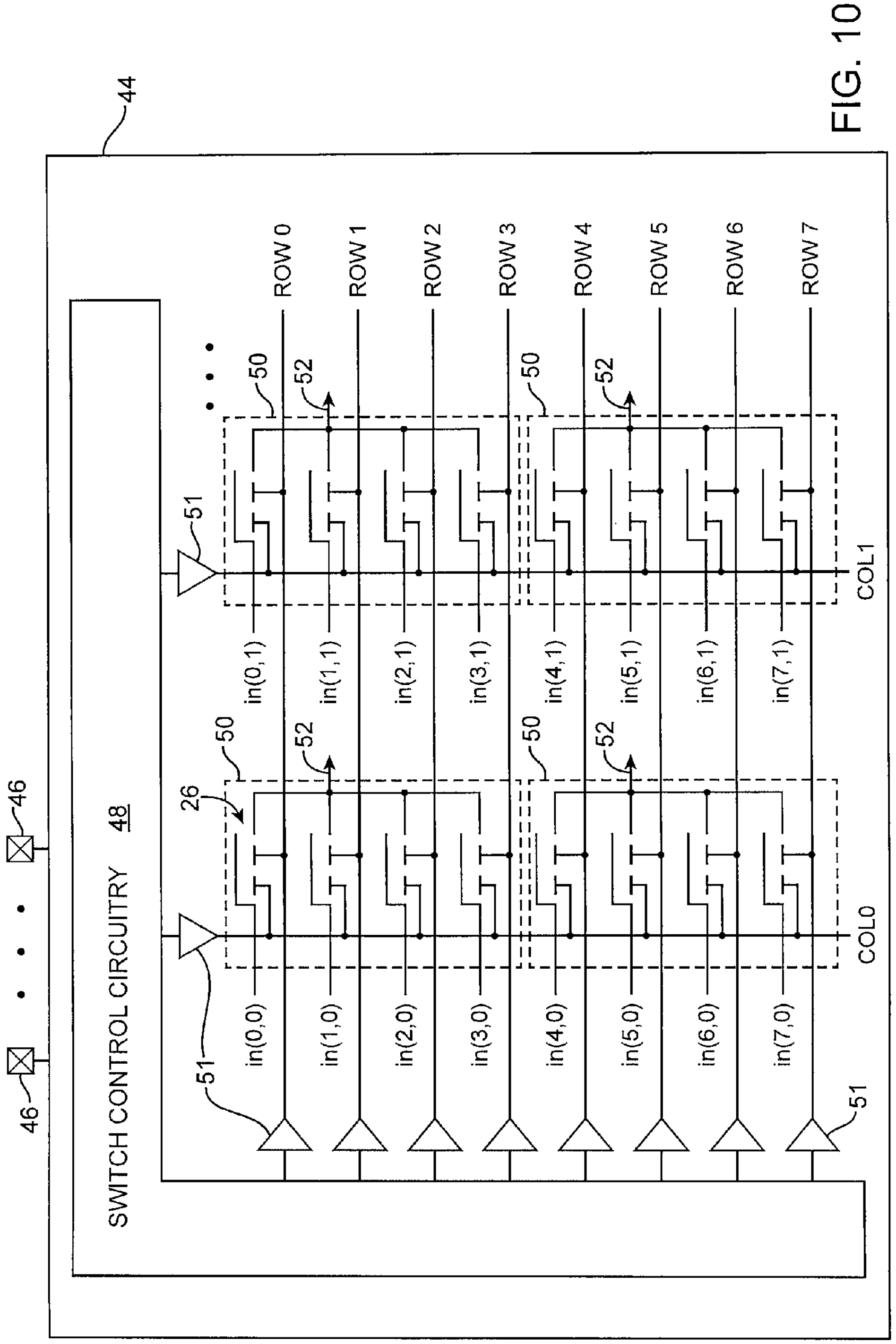
FIG. 10 is a schematic diagram of configurable multi-gate switch circuitry in accordance with an embodiment of the present invention.

Configurable multi-gate switch circuitry may be formed on an integrated circuit, such as integrated circuit 44 of FIG. 10. Integrated circuit 44 may have external supply pins 46 that receive power supply signals and ground signals from off-chip sources. Pins 46 may also be coupled to input-output circuitry that conveys data into and out of integrated circuit 44.

The multi-gate switch circuitry on circuit 44 may include switch control circuitry 48 and an array of multi-gate switches 26. Switch control circuitry 48 may provide row control signals and column control signals. The row and column control signals may be used to configure the array of multi-gate switches. The row and column control signals may be buffered using buffers 51.

The array of multi-gate switches may have switches 26 arranged in rows and columns. Each row control signal may be connected to the second gates of the multi-gate switches that are arranged along a corresponding row. Each column control signal may be connected to the first gates of the multi-gate switches that are arranged along a corresponding column. The switches in each column may be arranged into groups of four. Each group of four multi-gate switches may form a multiplexer 50 (e.g., a 4-to-1 multiplexer). In each group of four switches, the second terminals of the switches may be connected together to form multiplexer output 52. The first terminals of each multi-gate switch in each multiplexer 50 may be connected to separate inputs (e.g., in(0,0), in(1,0), etc.) fed from other circuitry (not shown) on integrated circuit 44. The separate inputs may not be connected together because they are connected to distinct signal paths. If desired, at least some of the separate inputs may be connected to a common signal path.

The switch circuitry of FIG. 10 is merely illustrative. For example, two-to-one multiplexers, 8-to-1 multiplexer, or other types of circuits may be implemented on circuit 44, if desired. Furthermore, it is not necessary that there be a switch located at the intersection of every row and column.

The example of FIG. 10 includes an 8 by 2 array of multi-gate switches (e.g., 16 switches are shown). In practice, larger or smaller arrays of switches may be formed. With the configuration of FIG. 10, switch control circuitry may provide 8 corresponding row control signals and 2 corresponding column control signals to configure the 16 switches. Each control signal may require one controlling circuit. The configurable switch circuitry of FIG. 10 may therefore require 10 controlling circuits. If conventional single-gate switches were used, 16 dedicated controlling circuits would be required. Using multi-gate switches 26 instead of conventional single-gate switches may therefore significantly decrease the number of controlling circuits used for a given array, especially in large switch arrays. For example, in a 128 by 256 switch array, 32,768 controlling circuits would be required if conventional single-gate switches were used (as described previously). However, only 384 controlling circuits (e.g., 128 plus 256) would be required if multi-gate switches 26 were used. If desired, arrays of any dimension and number of switches may be formed. The configuration of FIG. 10 is merely illustrative.

Figure 11:
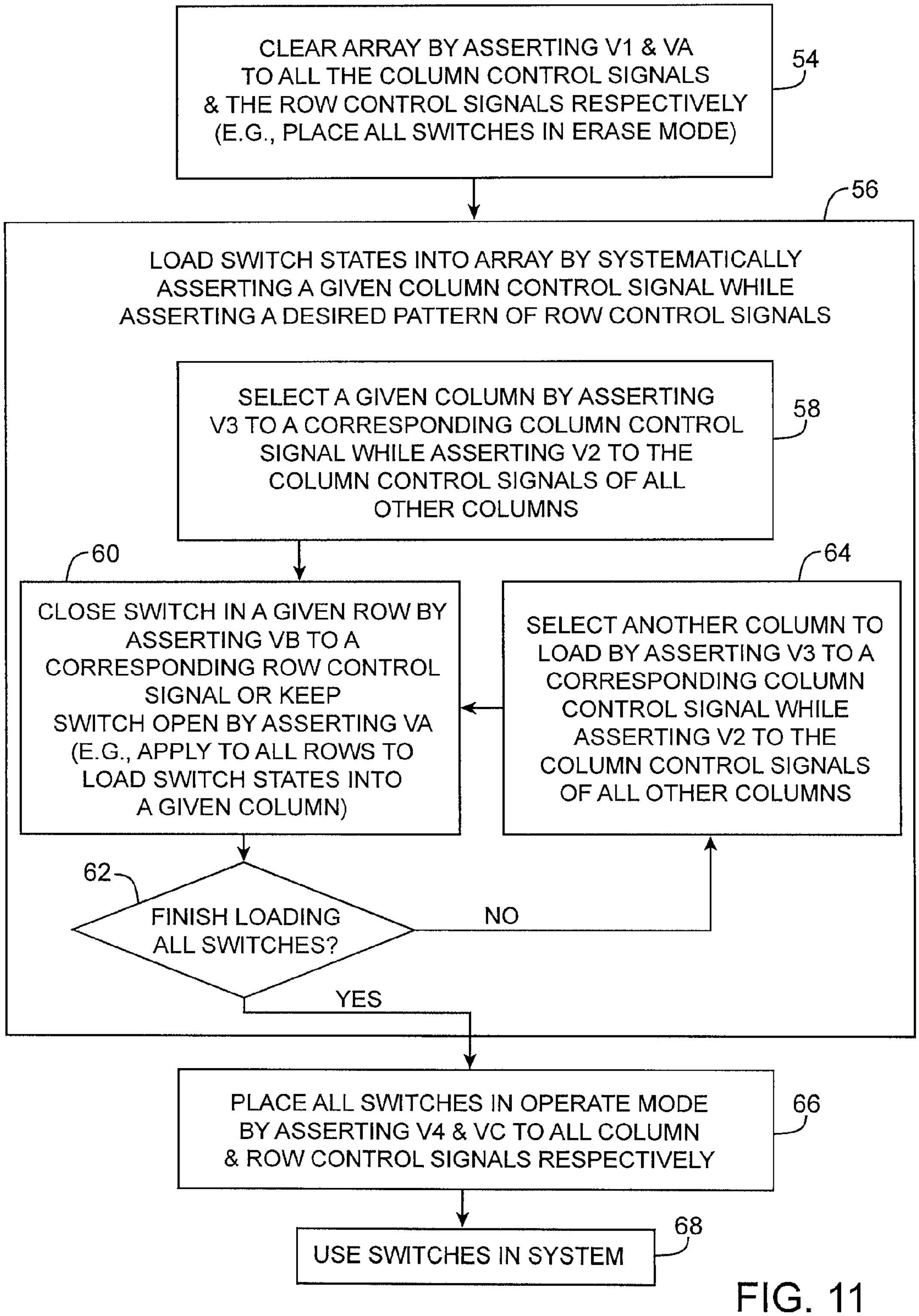
FIG. 11 is a flow chart of illustrative steps involved in configuring configurable multi-gate switch circuitry of the type shown in FIG. 10 in accordance with an embodiment of the present invention.

FIG. 11 shows illustrative steps involved in configuring multi-gate switch circuitry of the type described in connection with FIG. 10. Initially, the switch array may be cleared (e.g., reset) by placing voltages V1 and VA on all of the column and row control signal lines respectively (step 54). This combination of column and row control signals results in a VGS12 value that corresponds to the erase mode that opens all of the switches. The row and column control signals may be asserted simultaneously or sequentially.

After the reset phase, desired switch states may be configured (i.e., a desired set of switch configuration data may be loaded) into the array by systematically asserting a given column control signal while asserting a desired pattern of row control signals (step 56). For example, at step 58, a given column may be selected by taking a corresponding column control signal to V3. The other column control signals may be driven to V2. With this type of arrangement, the switches in the other columns will remain in the hold mode regardless of the voltage value that is applied to VG2 (see, e.g., rows C and D of FIG. 7).

A certain switch on the selected column may be closed by driving voltage VB onto a corresponding row control signal line (see, e.g., row F of FIG. 7). Otherwise, placing voltage VA on a corresponding row control signal line may keep the switch open (step 60). The row control signals may be asserted simultaneously (e.g., using a scan chain) or sequentially (e.g., using a decoder).

If there are more columns to be configured (step 62), another column may be selected for loading (step 64). The another column may be loaded in the same way as described previously in step 60.

Once the desired switch states have been loaded into the entire array, the switches may be placed in the operate mode by driving voltages V4 and VC onto all of the column and row control signals, respectively (step 66). When driven in this way, the switches will remain within the hysteresis loop (between VPO and VPI) and will retain their desired loaded switch states.

The switches may then be used as parts of a system such as a computer system (step 68). The switches may be used as a configurable switching network. The switches may be used in programmable circuits such as programmable logic device circuits to provide desired custom logic functions (e.g., user circuit designs). In this type of environment, the switches may be configured to form desired electrical connections based on programming data that is created using a computer-aided design system. If desired, the switches may be used in other types of integrated circuits (e.g., as cross-bar switches, parts of application-specific integrated circuits, etc.).

The multi-gate switch circuitry may be configured more than once after start-up. A new set of switch states may be loaded at any time to provide desired functionality.

Figure 12:
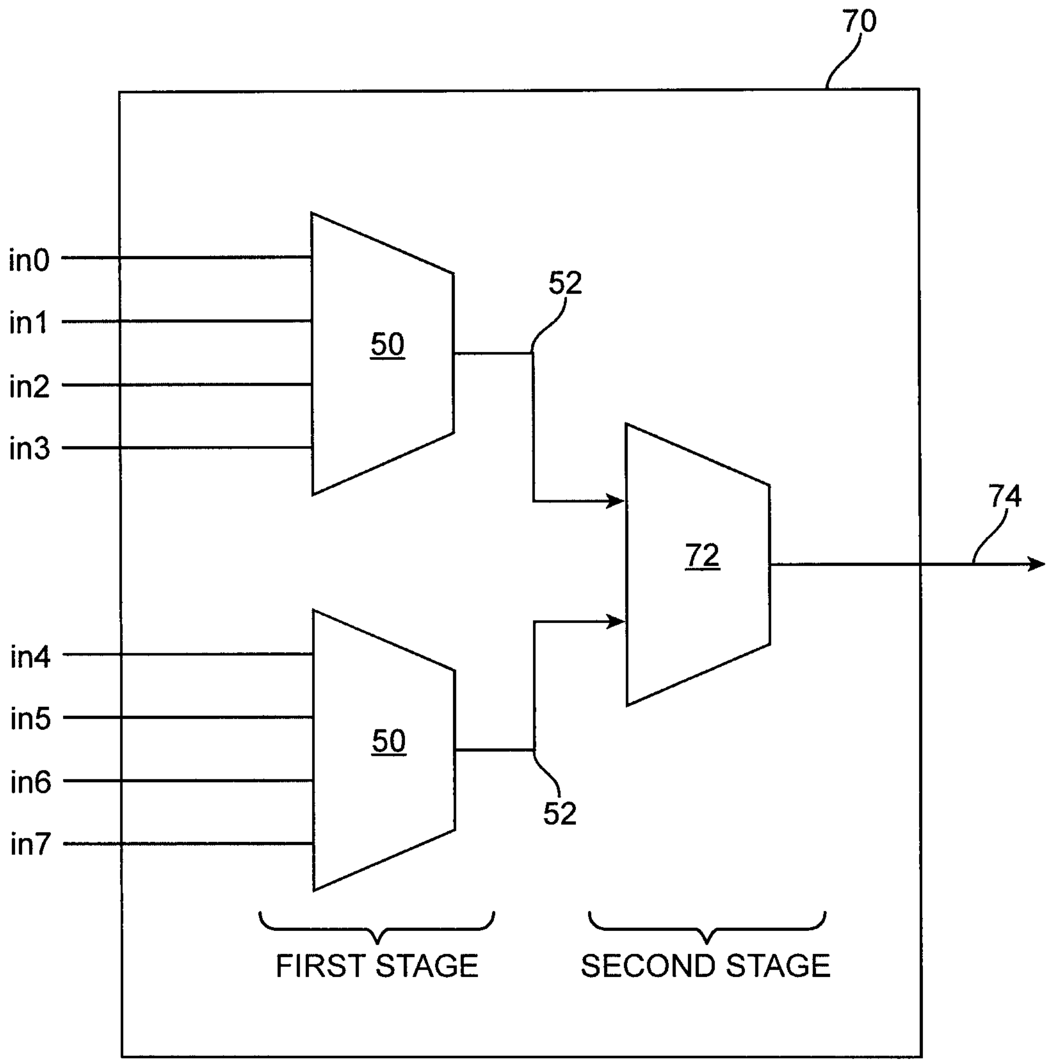
FIG. 12 is a schematic diagram of a two-stage configurable multi-gate switch circuit in accordance with an embodiment of the present invention.

If desired, multiplexers may be cascaded to form multi-stage multiplexers. As shown in FIG. 12, two 4-to-1 multiplexer 50 may have two output paths 52. A 2-to-1 multiplexer 72 may have two input terminals. The two output paths may be connected to the two input terminals of multiplexer 72. The two multiplexers 50 may form a first state. Multiplexer 72 may form a second stage. The first stage cascaded with the second stage may form 8-to-1 multiplexer 70. Multiplexer 72 may have an output that forms output 74 of multiplexer 70. Multiplexer 70 may select one of eight input signals (e.g., in0-in7) to connect to output 74. More complex multiplexers may be formed using this type of cascaded configuration (e.g., 16-to-1 multiplexers, 32-to-1 multiplexers, etc.).

Figure 13:
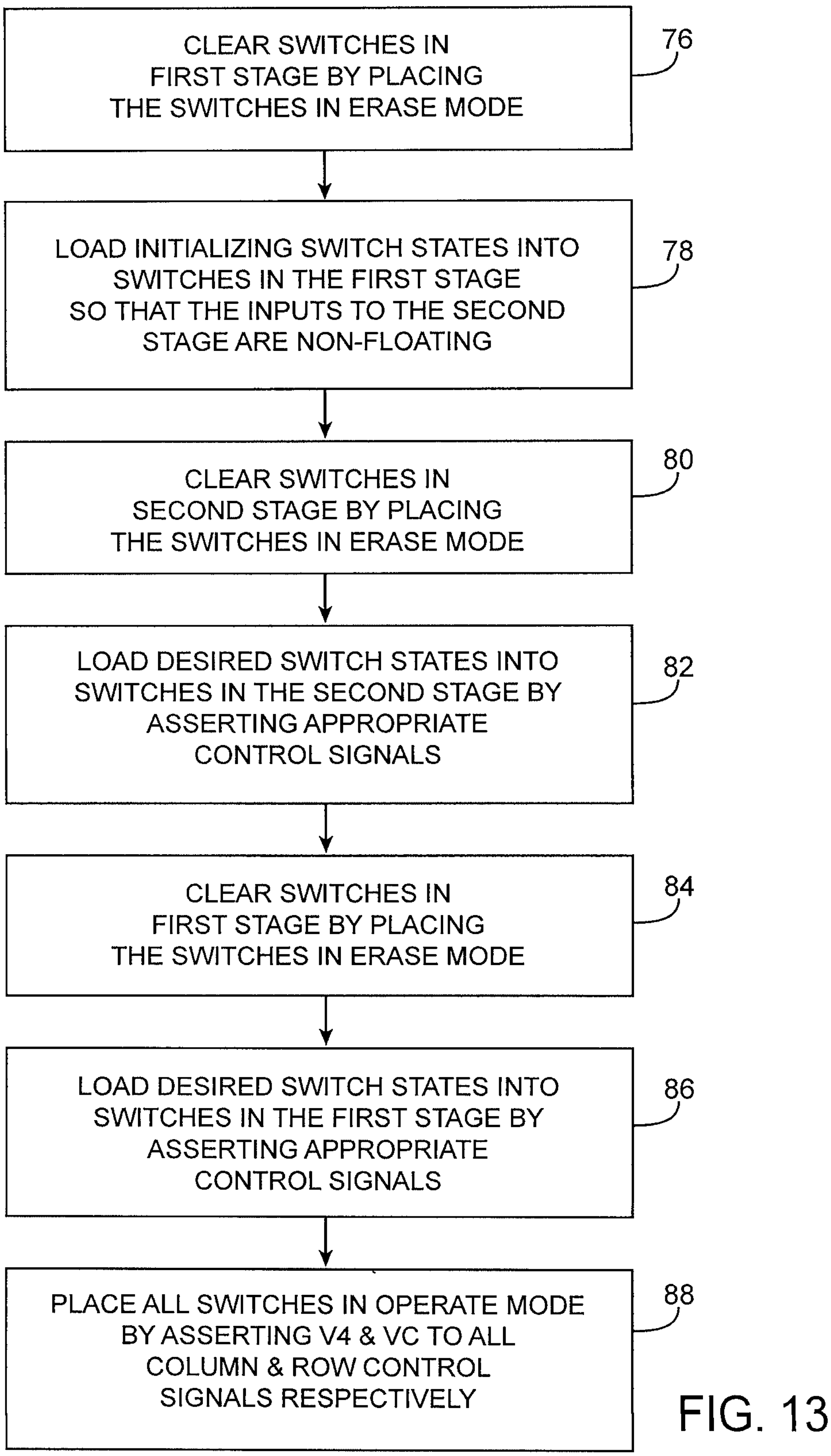
FIG. 13 is a flow chart of illustrative steps involved in configuring two-stage configurable multi-gate switch circuitry of the type shown in FIG. 12 in accordance with an embodiment of the present invention.

Configuration of a two-stage multiplexer of the type shown in FIG. 12 may involve additional loading steps, as shown in FIG. 13. At step 76, the switches in the first stage (multiplexers 50) may be cleared. After reset, the switches in the first stage may be loaded with initializing switch states. Configured in this way, the inputs (e.g. paths 52) to the second stage (multiplexer 72) are non-floating.

At step 80, the switches in the second stage may be cleared. Once the switches in the second stage have been cleared, desired switch states may be loaded into the switches in the second stage (step 82).

At this point, the switches in the first stage may be cleared again (step 84). At step 86, desired switch states may be loaded into the switches in the first stage. Once the switches in the first and second stage have been loaded with the desired switch states, all the switches in multiplexer 70 may be placed in the operate mode.

The foregoing is merely illustrative of the principles of this invention and various modifications can be made by those skilled in the art without departing from the scope and spirit of the invention.

What is claimed is:

1. Multi-gate switch circuitry comprising:

a multi-gate switch comprising a single source terminal and a single drain terminal formed on a substrate, first and second control gates formed on a surface of the substrate between the source and drain terminals, and a single flexible conductive structure that flexes in response to voltages directly applied on the first control gate and the second control gate, wherein flexing the flexible conductive structure shorts the source and drain terminals, wherein the surface on which the first control gate is formed is coplanar with the surface on which the second control gate is formed, and wherein the surface on which the source and drain terminals are formed is substantially coplanar with the surface on which the first and second control gates are formed.

2. The multi-gate switch circuitry defined in claim 1, further comprising:

a conductive path electrically coupling the drain terminal of the multi-gate switch to a drain terminal of a second multi-gate switch in a plurality of multi-gate switches to form a multiplexer.

3. The multi-gate switch circuitry defined in claim 1, further comprising:

first and second control signal lines, wherein the first control gate is coupled to a first control gate of a second multi-gate switch in a plurality of multi-gate switches and wherein the second control gate is coupled to a second control gate of a third multi-gate switch in the plurality of multi-gate switches.

4. The multi-gate switch circuitry defined in claim 1, further comprising:

a plurality of signal paths, wherein the source terminal of the multi-gate switch is coupled to a selected one of the plurality of signal paths.

5. The multi-gate switch circuitry defined in claim 1, wherein the source and drain terminals are shorted through the flexible conductive structure when the flexible conductive structure is flexed.

6. The multi-gate switch circuitry defined in claim 1, wherein the source terminal is always electrically shorted to the flexible conductive structure.

7. An integrated circuit, comprising:

an array of multi-gate switches arranged in rows and columns, wherein each of the multi-gate switches comprises first and second gates, source and drain terminals, and a flexible conductive structure operable to flex in response to voltages applied to the first and second gates, and wherein flexing of the flexible conductive structure is operable to short the source and drain terminals;

a first column control line, wherein each multi-gate switch in a first subset of the array of multi-gate switches has its first gate coupled to the first column control line, its source terminal receiving a first respective different input signal, and its drain terminal connected to a first shared output node;

a second column control line, wherein each multi-gate switch in a second subset of the array of multi-gate switches has its first gate coupled to the second column control line, its source terminal receiving a second respective different input signal, and its drain terminal connected to a second shared output node; and a row control line, wherein one of the multi-gate switches in the first subset and one of the multi-gate switches in the second subset have second gates that are coupled to the row control line.

8. The integrated circuit defined in claim 7, wherein the first subset of the array of multi-gate switches comprises a first multiplexing circuit, and wherein the second subset of the array of multi-gate switches comprises a second multiplexing circuit that is separate from the first multiplexing circuit.

9. The integrated circuit defined in claim 7, further comprising:

circuitry that provides a plurality of first different input signals to the source terminals of the multi-gate switches in the first subset via distinct signal paths.

10. The integrated circuit defined in claim 7, wherein each multi-gate switch in the array of multi-gate switches has first and second gates formed on a substrate between the source and drain terminal of that multi-gate switch.

* * * * *